United States Patent [19]
Gardner et al.

[11] Patent Number: 5,795,807
[45] Date of Patent: Aug. 18, 1998

[54] SEMICONDUCTOR DEVICE HAVING A GROUP OF HIGH PERFORMANCE TRANSISTORS AND METHOD OF MANUFACTURE THEREOF

[75] Inventors: Mark I. Gardner, Cedar Creek; Daniel Kadosh, Austin, both of Tex.

[73] Assignee: Advanced Micro Devices, Austin, Tex.

[21] Appl. No.: 771,131

[22] Filed: Dec. 20, 1996

[51] Int. Cl.⁶ .................................................. H01L 21/265
[52] U.S. Cl. .................................................. 438/279; 438/286
[58] Field of Search ............................. 438/279, 286, 438/305, 306, 919

[56] References Cited

U.S. PATENT DOCUMENTS

| | | | |
|---|---|---|---|
| 4,104,784 | 8/1978 | Klein | 438/286 |
| 4,280,855 | 7/1981 | Bertin et al. | 438/279 |
| 4,514,894 | 5/1985 | Kawagoe | 438/279 |
| 4,753,897 | 6/1988 | Lund et al. | 438/306 |
| 5,040,035 | 8/1991 | Gabara et al. | 438/279 |
| 5,252,505 | 10/1993 | Yatsuda et al. | 438/286 |
| 5,633,185 | 5/1997 | Yiu et al. | 438/258 |

*Primary Examiner*—Jey Tsai
*Assistant Examiner*—Richard A. Booth
*Attorney, Agent, or Firm*—Merchant, Gould, Smith, Edell, Welter & Schmidt, P.A.

[57] ABSTRACT

A semiconductor device may be fabricated using a process in which a group of transistors connected between a high and low voltage sources are formed. The transistor among the group of transistors which is used for connection to the high voltage source has non-symmetrical source and drain regions. The device, exploits low operating voltages to construct new high performance transistors.

10 Claims, 6 Drawing Sheets

SEMICONDUCTOR DEVICE HAVING A GROUP OF HIGH PERFORMANCE TRANSISTORS AND METHOD OF MANUFACTURE THEREOF

FIELD OF THE INVENTION

The present invention is directed generally to a semiconductor devices and to a method of manufacture thereof and, more particularly, to fabrication of a sequence of high performance semiconductor devices.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistors (MOSFET).

Large numbers of such semiconductor devices are used as basic building blocks for most modern electronic devices. In order to increase the capability and performance of electronic devices implemented using semiconductor devices, it is desirable to increase the number of semiconductor devices which may be formed on a given surface area of a chip wafer. It is also desirable to increase the operating speed, reliability and performance of the semiconductor devices. To accomplish these goals, it is desirable to reduce the size of the semiconductor devices without degrading their performance. It is also desirable to increase operating performance and speed of the devices. New semiconductor fabrication processes and devices are therefore needed to continue the trend of reduced semiconductor device size and increased performance.

SUMMARY OF THE INVENTION

Generally, the present invention relates to a semiconductor device and fabrication process exploiting low operating voltage to obtain improved performance.

In one embodiment, a fabrication process is used to form a semiconductor device having a group of transistors connected in series between a high and a low voltage source. The process includes forming a plurality of gate electrodes on a substrate, each being used to one of the transistors. A first dopant, of a first conductivity type, is implanted into regions of the substrate adjacent edges of the plurality of gate electrodes to form a plurality of active regions in the substrate having a first conductivity characteristic. A second dopant, of a second conductivity type, is selectively implanted into a first active region formed adjacent one side of a particular gate electrode of the plurality of gate electrodes such that the first active region has second conductivity characteristic while a second active region formed adjacent an opposing side of the particular gate electrode retains the first conductivity characteristics. A transistor formed using the particular gate electrode is closest to the high voltage source among the group of transistors.

A semiconductor device, in accordance with an embodiment of the invention, includes a first and second transistor coupled in series between a relatively high voltage source and a relatively low voltage source. An first active region of the first transistor is coupled to the low voltage source. A second active region of the first transistor is shared with the second transistor A third active of the second transistor is coupled to the relatively high voltage source. The second and third active regions have different conductivity characteristics.

The above summary of the present invention is not intended to describe each illustrated embodiment or every implementation of the present invention. The figures and the detailed description which follow more particularly exemplify these embodiments.

BRIEF DESCRIPTION OF THE DRAWING

The invention may be more completely understood in consideration of the following detailed description of various embodiments of the invention in connection with the accompanying drawings, in which.

Figure 1:
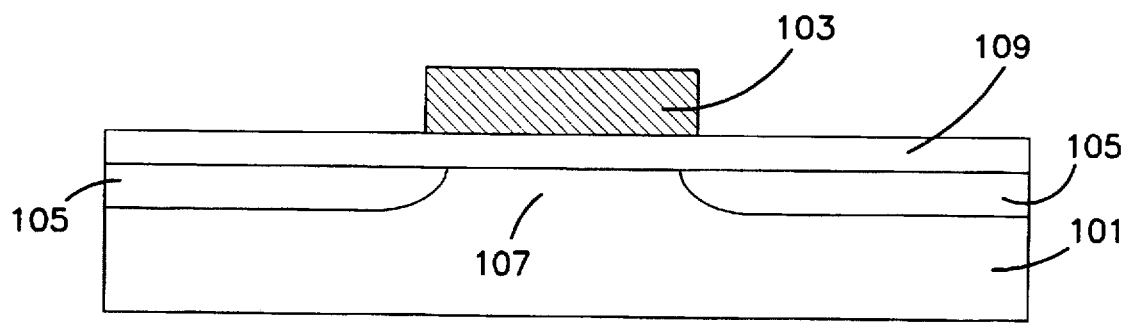
FIG. 1 illustrates components of one typical MOSFET semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention will be applicable to a number of semiconductor devices. The present invention is believed to be particularly suited to devices which employ two or more MOS semiconductor devices which share a common source/drain region (e.g., two MOS transistors connected in series). While the present invention is not limited to such devices, an appreciation of various aspects of the invention will be gained through a discussion of various fabrication processes and device characteristics in connection with the examples provided below.

As semiconductor devices have been made smaller, the operating voltage applied to the semiconductor devices has also been reduced. For example, the operating voltages of many semiconductor devices is 3.0 Volts (V) or less. In accordance with one aspect of the present invention, the characteristics of semiconductor devices operating at the lower operating voltages are exploited. In one embodiment of the invention, two or more high performance devices, connected in series, are fabricated with different characteristics which take into account the operating voltages which will be seen by the various devices.

Figure 2:
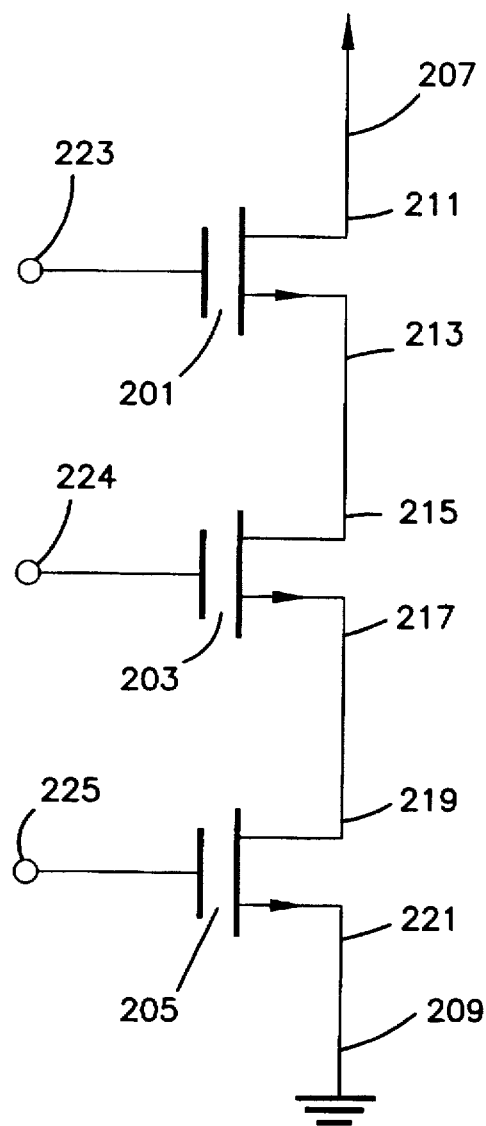
FIG. 2 illustrates a series of n-channel transistors.

FIG. 2 illustrates three n-channel transistors 201, 203 & 205 connected in series between a high voltage source 207 (Vdd) and a low voltage source 209 (e.g., ground). In the illustrated circuit, the drain of the first transistor is 201 is coupled to the high voltage source 207. The source of the first transistor 201 is coupled to the drain 215 of the second transistor 203. Similarly, the source 217 of the second transistor 203 is coupled to the drain 219 of the third transistor 205. As will be appreciated, source and drain regions of adjacent transistors connected in this fashion may be formed using a common active region in the substrate on which the transistors are formed. In the illustrated circuit, the source 221 of the third transistor 205 is coupled to the low voltage source. Gate terminals 223-225 of the three transistors are respectively coupled to the gates of the first through third transistors 201, 203 and 205. Terminals (not shown) may also be connected to the source/drain between the first and second transistors 201 and 203 and to the source/drain between the second and third transistors 203 and 205 if required by the function of the overall circuit.

Transistors like those illustrated in FIG. 2 experience a voltage drop $V_t$ across the transistor. Because of this voltage drop, the effective operating voltage seen by the second transistor 203 in the illustrated circuit is lower. For example, in a system having a high voltage source 207 of 3 V and a voltage drop $V_t$ associated with the first transistor of 0.6 V, the effective voltage at the drain 215 of the second transistor 203 would be 2.4 V. As the operating voltage seen by a transistor is reduced, it becomes possible to modify the construction of the transistor to take advantage of the lower voltage. As noted above, in accordance with one aspect of this invention the voltage drop $V_t$ may be exploited during the fabrication of such transistors to improve performance. Exploitation of the voltage drop $V_t$ can also be used to simplify the fabrication process of such transistors.

Figure 3A:
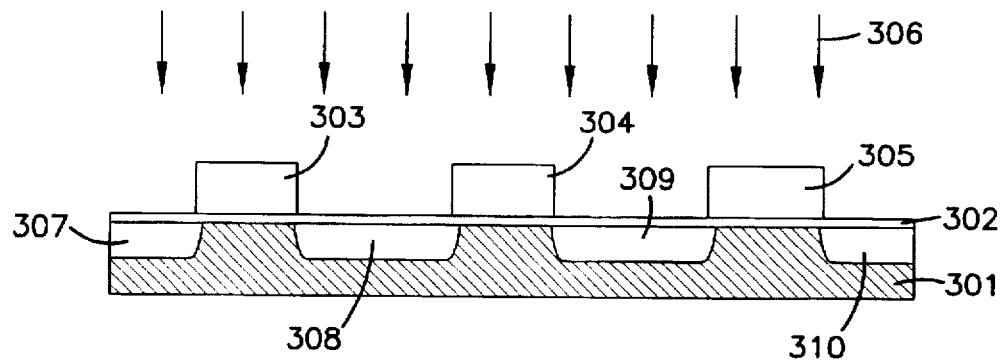
FIGS. 3A–3C illustrate a fabrication process in accordance with an embodiment of the invention.
Figure 3B:
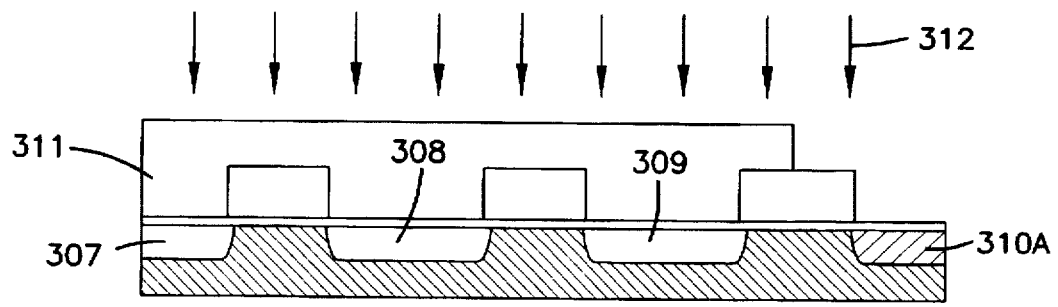
Figure 3C:
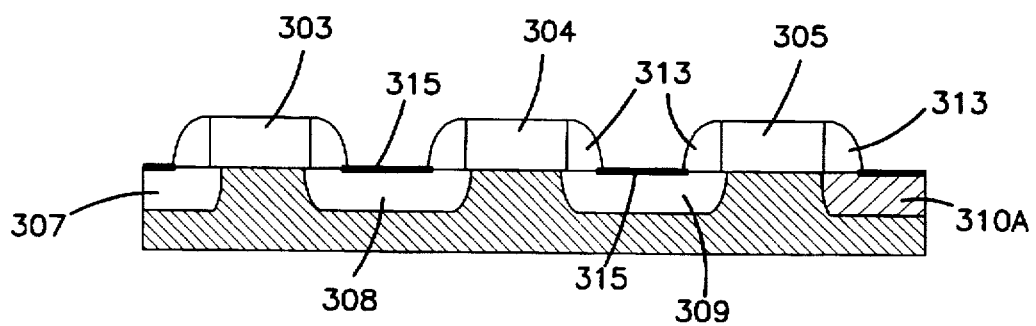

FIGS. 3A-3C illustrate a fabrication process in accordance with one particular embodiment of the present invention which illustrates an exemplary method of exploiting the above-described voltage drop $V_t$. It should be appreciated that the general features of the example fabrication process illustrated in FIGS. 3A-3C could be used to fabricate a number of different types of semiconductor devices. Moreover, the number of devices used and overall configuration of devices formed could be modified in consideration of the circuit to be formed without departing from the invention. To facilitate explanation, an example of a process used to form a series of three n-channel devices coupled between a high and low voltage source is described.

Using well known techniques, three gate electrodes 303-305 are formed on a substrate 301. The gate electrodes 303-305 will typically be insulated from the substrate 301 by a thin gate oxide layer 302. The gate electrodes 303-305 will be used to form a set of transistors connected in series (e.g., adjacent transistors will share a common source/drain) between a high and low voltage source. Using the gate electrodes 303-305 for alignment, a high dose implant of an n-type dopant 306 is carried out to form a number of active regions 307-310 in the substrate 301 as illustrated in FIG. 3A. The active regions 307-310 will serve as source/drain regions of the transistors being formed.

A mask 311 is selectively formed, using a resist material for example, to cover all but one of the active regions 307-310. As will be more fully described below, the exposed active region 310 corresponds to an active region which will be used to coupled the group of transistors to the high voltage source. With the mask 311 in place, a second dopant 312, having a conductivity type opposite to that of the first implant, is implanted into the unmasked active region 310 to counter-dope the high dose implant in that region. In the illustrated fabrication process, the first dopant may be arsenic, for example, and the second dopant may be boron.

In the illustrated example, the unmasked active region 310 will typically function as a drain for its corresponding transistor. The drain may be directly connected to the high voltage source, or coupled thereto via other elements. The active region 307 on the other end of the substrate will be used to couple the group of transistors to the low voltage source. The counter-doping of the unmasked active region 310 reduces the conductivity of that region forming a less conductive active region 310A as illustrated in FIG. 3B. The conductivity of the masked active regions 307-309 will be unaffected. In this manner, a relatively high dose n-type implant is used to form highly conductive active regions 307-309 for the corresponding transistors.

In the process depicted in FIGS. 3A-3B, the uneven doping of source and drain regions corresponds to a transistor in the series which will be closest to the high voltage source, whether directly or indirectly coupled thereto. In this manner, the high voltage will be first seen by the active region 310A having a reduced conductive region. As described above, a voltage drop $V_t$ will be experienced across the corresponding transistor The other transistors, having higher conductive active regions 307-309, will accordingly see a lower operating voltage and will therefore be able to reliably operate using the higher conductive active regions 307-309.

In the above described process, it is not necessary to use spacers for the implantation of the active source/drain regions as in a typical process. This is due in part, to the non-symmetrical doping of the active regions of the transistor in the group used to coupled the group to the high voltage source (e.g., the transistor closest to the high voltage source). The lower operating voltages of the other transistors in the group, resulting from the voltage drop $V_t$ across the non-symmetrical transistor, also facilitates the fabrication of reliable spacerless transistors. In one embodiment of the invention, spacers 313 are formed after the second implantation and removal of the mask 311 to facilitate silicidation of active regions of the substrate. The spacers 313, as illustrated in FIG. 3C, serve to insulate the silicide layer 315 formed over the active regions 307–309 and 310A from the gate electrodes 303–305.

In the manner described above, a series of transistors are formed which have improved performance. Active source and drain regions in the substrate corresponding to a transistor which is closest to the high voltage source have different conductivity characteristics. In the illustrated example, the active region used to coupled the transistor to the high voltage source has a lower conductivity while the active region used to coupled the transistor to the other transistors in the series has a higher conductivity. This structure exploits the voltage drop across this transistor and provides improved performance. For example, the other transistors in the series have higher conductive active regions, increasing the speed and performance of the transistors.

In the above example, the transistor having different conductivity characteristics for its source and drain is the closest transistor, among the group of transistors, to the high voltage source. However, as noted above, this transistor may be either directly or indirectly connected to the high voltage source. In an alternative embodiment of the invention, it may be desirable or necessary to use symmetrical lower conductive active regions for one or more transistor in a series of transistors. A example of a process for fabricating such an embodiment will be described in connection with FIGS. 4A–4C.

Figure 4A:
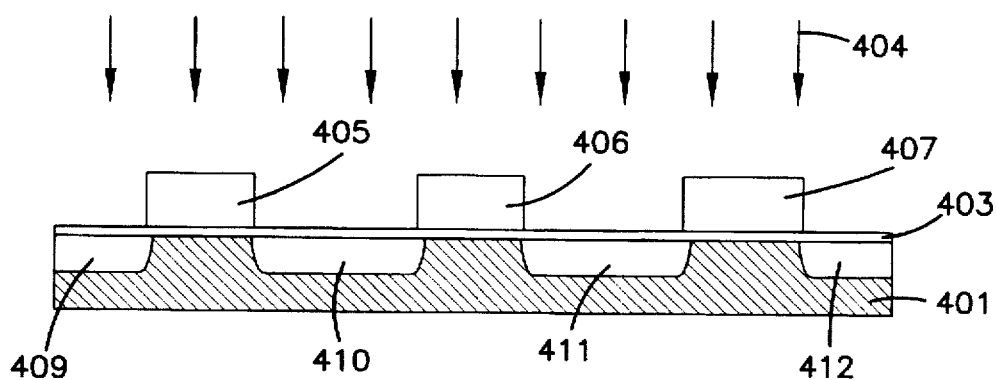
FIGS. 4A–4C illustrate another fabrication process in accordance with an embodiment of the invention.
Figure 4B:
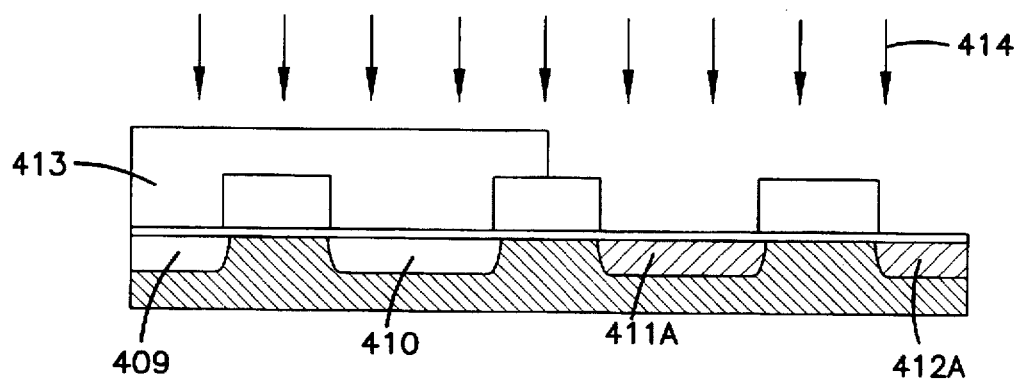
Figure 4C:
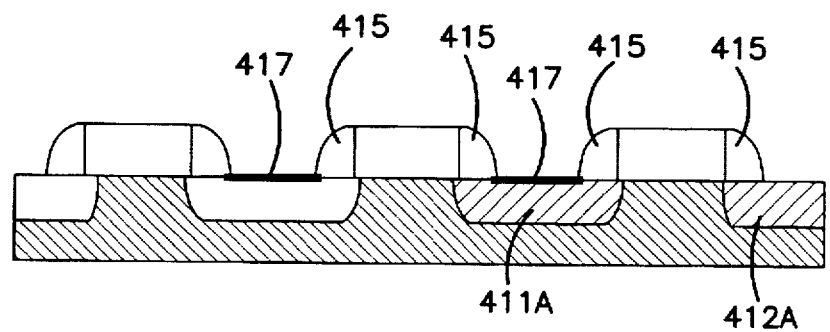

As above, the process depicted in FIGS. 4A–4C is provided by way of example and not of limitation. For purposes of illustration, a process for fabricating a series of three n-channel transistors is described. Three gate electrodes 405–407 are formed on a substrate 401 and gate oxide 403 using well know techniques. A high dose blanket implantation of an n-type dopant 404 is implanted into the substrate to form a highly conductive active regions 409–412 in the substrate 401 aligned by the gate electrodes 405–407 as illustrated in FIG. 4A.

A mask layer 413 is selectively formed to cover the first transistor on the left and half of the middle transistor. With the mask in place, a second dopant 414, of opposite conductivity type to the first dopant 404, is implanted into the unmasked active regions 411 and 412. In this manner, lower conductivity active regions 411A and 412B are formed on each side of the transistor on the far right, with the middle transistor having differently doped source and drain regions as depicted in FIG. 4B. In this process, as in the previous process, a transistor is formed having different conductivity characteristics in its source and drain. This transistor shares its high conductive active region 410 with an adjacent transistor on the low voltage side of the series which has symmetrical high conductive active regions 409 and 410. The low conductive active region 411A of the non-symmetrical transistor is shared with an adjacent transistor on the high voltage side which has symmetrical low conductive active regions 411A and 411B.

As in the above example, spacers 415 may be formed and a silicide layer 417 may be formed on the surfaces of the active regions. The resultant structure is illustrated in FIG. 4C.

The above process and structure may be advantageously used, for example, where the voltage drop across a first transistor connected to the high voltage source does not sufficiently ensure reliable operation using the higher conductive active regions. In general, in accordance with the embodiments of the present invention, two implantation processes are used to create a transistor having an active region on one side of the corresponding gate electrode which is less conductive than an active region on the other side. The particular transistor, among a series of transistors, which has different conductivity characteristics for its source and drain regions will generally be selected to be a transistor as close to the high voltage source as permissible under the voltage and design constraints of the devices.

It will be appreciated that the number of transistors formed on either side of the particular transistor may be varied. A number of transistors having the high conductivity active regions can be used when the channel length is relatively short. In this manner, improved performance may be obtained without reducing the reliability of the device. In general, the non-symmetrical transistor and the high conductance transistors may be considered a group of transistors connected in series which in turn are connected to the high voltage source via a third transistors. In the particular embodiment of FIGS. 4A–4C, the third transistor is also uniquely formed as part of the non-symmetrical implantation process.

In the above described embodiments, lightly doped n-type regions (e.g., used in the formation of lightly doped drain (LDD) devices) are not used. In an alternative embodiment of the present invention, different conductivity characteristics may be formed on opposing sides of a transistor gate electrode employing an LDD region. One particular embodiment of a fabrication process for forming an LDD structure in accordance with the present invention is depicted in FIGS. 5A–5D. As above, to facilitate an explanation of the process the formation of basic elements of a series of three n-channel transistors will be described. It will be appreciated that other types of devices could be fabricated.

Figure 5A:
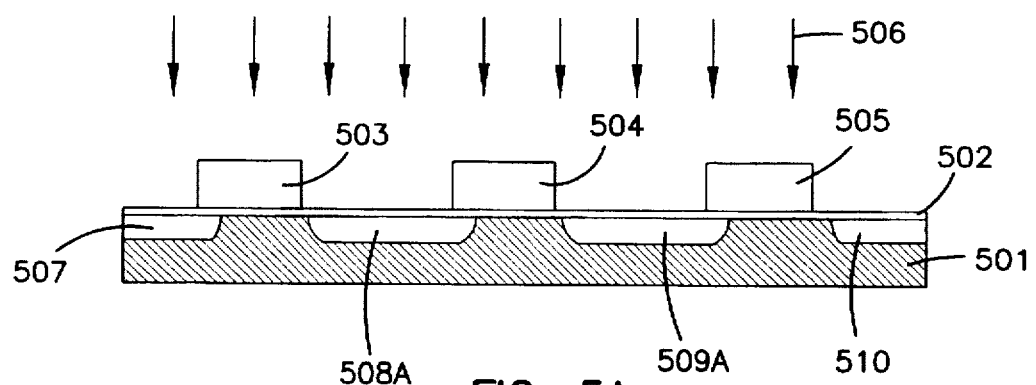
FIGS. 5A–5D illustrate still another fabrication process in accordance with an embodiment of the invention.
Figure 5B:
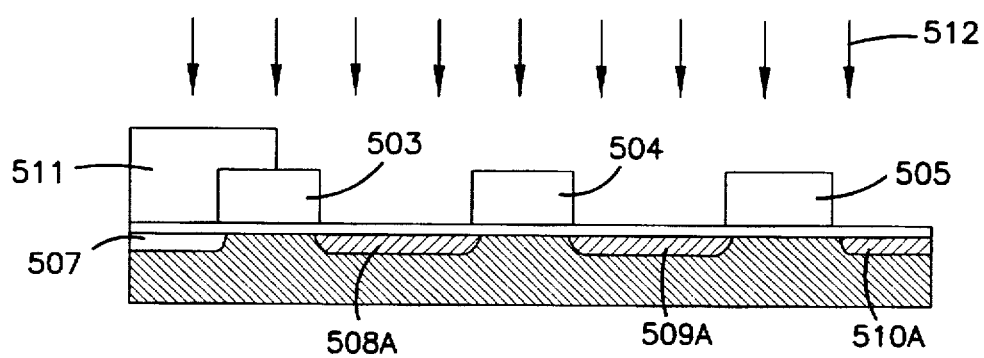

Using well known techniques, three polysilicon gate electrodes 503–505 are formed on a substrate 501 and gate oxide 502 structure. An n-type dopant 506 is implanted over the structure to form shallow active regions 507–510 in the substrate 501 using the gate electrodes 503–505 for alignment as illustrated in FIG. 5A. The active regions 507–510 are used to form LDD regions as described more fully below. The implant dosage is relatively high compared to conventional LLD implants.

Following the first implant, active region 507 corresponding to the transistor which is closest to the high voltage source, is masked with a mask layer 511 leaving the other active regions 508–510 formed in the substrate 501 unmasked. In the illustrated example, the masked active region is on the source side of the transistor closest to the high voltage source. With the mask 510 in place, a second dopant 512, having a different conductivity type (a p-type dopant in the illustrated example), is implanted into the unmasked regions to reduce the conductivity of the active regions 508–510 formed by the first implant. In this manner, LDD regions 508A–510A having a relatively lower conductivity are formed in the unmasked active regions. Using this technique, LDD regions may be selectively formed in desired regions of the substrate 501. As will be understood, the active regions 507 and 508A of the transistor closest to the high voltage source have different conductivity characteristics.

Figure 5C:
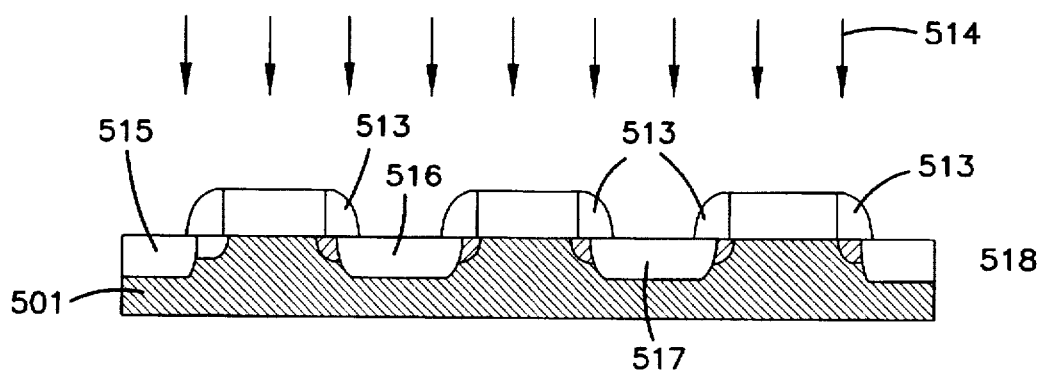

After the implantation of the second dopant 512, the mask layer 511 is removed and a spacer layer is deposited and etched to form spacers 513. The spacers are used for alignment during a second, relatively high dose implant of an n-type dopant 514 to form source/drain regions 515–518 in the substrate 501 as illustrated in FIG. 5C. In this manner, source/drain structures having an LDD region are formed in the substrate 501.

Figure 5D:
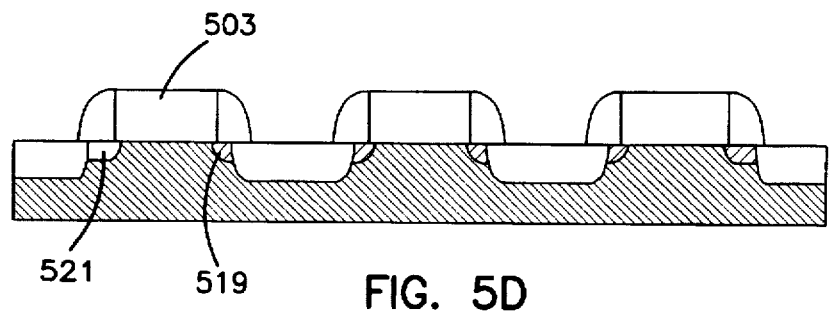

As noted above, the active regions forming a source and drain of a transistor on the high voltage side of a series of transistors have different conductivity characteristics. In the illustrated example, a lightly doped LDD portion 519 is formed in the low voltage side of the transistor and a more heavily doped active region is formed on the high voltage side of the transistor as illustrated in FIG. 5D. In this manner, improved performance may be obtained by selectively doping opposing sides of a transistor such that the source and drain have different conductivity characteristics. As described above, the different conductivity characteristics exploit the voltage drop across the transistor and the fact that the transistor having different source and drain conductivity characteristics is closest to high voltage source among a group of transistors.

Figure 6A:
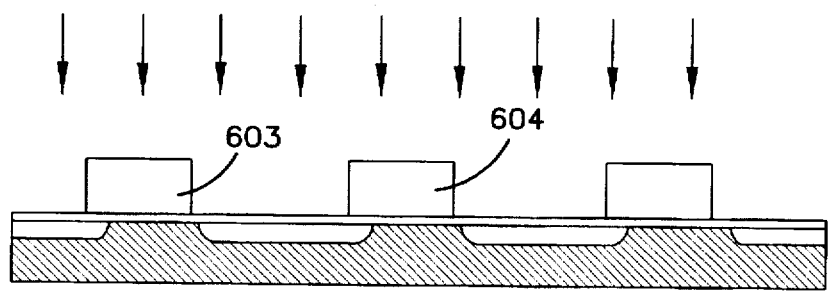
FIGS. 6A–6D illustrate another fabrication process in accordance with an embodiment of the invention.
Figure 6B:
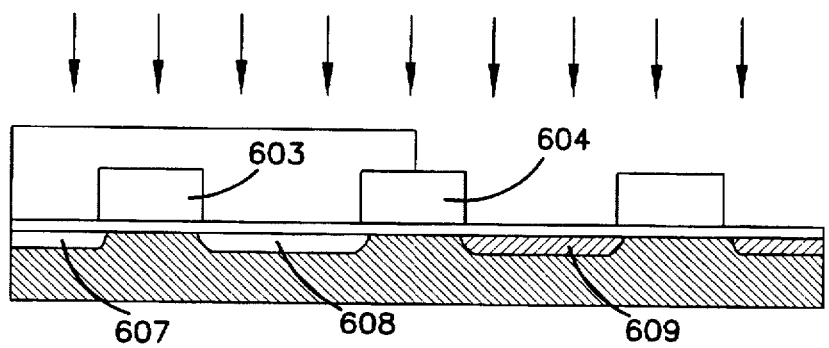
Figure 6C:
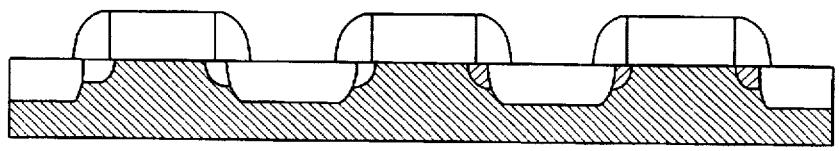
Figure 6D:
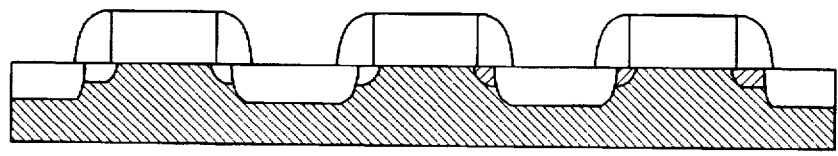

FIGS. 6A–6D illustrate another fabrication process in accordance with an embodiment of the invention. The process differs from the process described above in connection with FIGS. 5A–5D at the mask formation stage. In this embodiment, a mask 610 is formed which completely covers active regions 607 and 608 corresponding to a first gate electrode 603 on the high voltage side. In this manner, the mask additionally covers one active region 608 of a second gate electrode 604. The masked active region 608 shared with the first gate electrode 603. Using the mask for a selective implantation process, different conductivity characteristics are formed on opposite sides of the second gate electrode 604 as illustrated in FIG. 6B. As noted above, in certain instance, where more than two transistors are to be connected in series, it may desirable to have one or more transistors connected between the transistor having a source and drain with different conductivity characteristics and the high voltage source.

Using the above described processes, improved semiconductor devices can be fabricated using a relatively simple process. As noted above, the transistor which will have non-symmetrical source and drain regions depends on the voltage thresholds and overall layout and type of devices being fabricated. It will be appreciated, that the above-described examples are provided by way of illustration only. The advantages obtained are equally applicable to other types of devices. For example, with appropriate modification, the process may be used for the fabrication of p-channel devices, complimentary metal oxide (CMOS) devices, and the like.

Various other modifications to the fabrication process which exploit the present invention will be apparent on review of the present specification. For example, using various combinations of the selective masking and doping techniques, size limitations associated with conventional masking and doping processes can be overcome. As the distance between adjacent gate electrodes is reduced, for example, selectively doping of active regions can be done using the above described features. It should also be realized that in certain instances the above description of the source and drain regions could be reversed, particularly where smaller channel lengths are used. In general, selective non-symmetrical doping of the source and drain sides of a particular transistor to form different conductivity characteristics provides a number of advantages. This technique is particularly useful when the particular transistor is selected from a group of transistors as the closest to a high voltage source. The present invention exploits the voltage drop across series connected transistors to permit the construction of new devices. The advantages obtained from this approach increase as the operating voltages are further reduced.

As noted above, the present invention is applicable to the fabrication of a number of different devices exploiting such features. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device having a group of transistors connected in series between a high and a low voltage source, the process comprising:

forming a plurality of gate electrodes on a substrate, each gate electrode being used for one of the transistors;

implanting a first dopant of a first conductivity type into regions of the substrate adjacent edges of the plurality of gate electrodes to form a plurality of active regions in the substrate having a first conductivity characteristic; and selectively implanting a second dopant of a second conductivity type into a first active region formed adjacent one side of a particular gate electrode of the plurality of gate electrodes being used to form a particular transistor in the group of transistors, such that the first active region has a second conductivity characteristic while a second active region formed adjacent an opposing side of the particular gate electrode retains the first conductivity characteristic, the particular transistor in the group of transistors being closest to the high voltage source.

2. A process as recited in claim 1, wherein the selective implanting of the second dopant includes implanting the second dopant into only the first active region of the plurality of active regions such that active regions formed adjacent gate electrodes other than the particular gate electrode each have the first conductivity characteristic.

3. A process as recited in claim 2, wherein the plurality of active regions formed by the implanting of the first dopant comprise source/drain regions of the series of transistors.

4. A process as recited in claim 1, wherein the selective implanting of the second dopant includes implanting the second dopant into all active regions of the plurality of active regions other than the second active region such that active regions formed adjacent gate electrodes other than the particular gate electrode each have the second conductivity characteristic.

5. A process as recited in claim 4, wherein the plurality of active regions comprise LDD regions of the series of transistors.

6. A process of forming a semiconductor device having a group of transistors coupled between a high voltage source and a low voltage source, the process comprising:

forming a plurality of gate electrodes on a substrate, each gate electrode being used to form a transistor of the group of transistors;

implanting a first dopant of a first conductivity type into regions of the substrate aligned by the plurality of gate electrodes;

forming a mask layer over a first active region on one side of a particular one of the gate electrodes without masking a second active region on the other side of the particular gate electrode;

using the mask to selectively implant a second dopant of a second conductivity type into the second active region of the particular gate electrode such that first and second active regions of the particular gate electrode have a non-symmetrical conductivity characteristic, a transistor formed using the particular gate electrode being coupled between other transistors in the group of transistors and the high voltage source.

7. A process as recited in claim 6, wherein the first active region of the particular gate electrode is coupled to the high voltage source and the second active region of the particular gate electrode is coupled to the other transistors.

8. A process as recited in claim 7 wherein the non-symmetrical conductivity characteristic comprises a lightly doped drain (LDD) region in the second active region.

9. A process as recited in claim 6 wherein the second active region of the particular gate electrode is coupled to the high voltage source and the first active region of the particular gate electrode is coupled to the other transistors.

10. A process as recited in claim 9 wherein the first active region of the particular gate electrode has a higher conductivity than the second active region of the particular gate electrode to form non-symmetrical source/drain regions.

* * * * *

UNITED STATES PATENT AND TRADEMARK OFFICE
CERTIFICATE OF CORRECTION

PATENT NO.     : 5,795,807
DATED          : August 18, 1998
INVENTOR(S)    : Gardner et al.

Page 1 of 1

It is certified that error appears in the above-identified patent and that said Letters Patent is hereby corrected as shown below:

Column 1,
Line 8, "devices" should read -- device --.

Column 2,
Line 34, "An" should read -- A --.
Line 37, after the first instance of "transistor" please insert -- . --.

Column 3,
Line 34, after "transistor", please delete "is".

Column 4,
Line 28, "coupled" should read -- couple --.
Line 66, "coupled" should read -- couple --.

Column 6,
Line 23, "transistors" should read -- transistor --.

Signed and Sealed this

Twentieth Day of August, 2002

Attest:

Attesting Officer

JAMES E. ROGAN
Director of the United States Patent and Trademark Office